(12) United States Patent
Peng et al.

(10) Patent No.: US 9,236,877 B2
(45) Date of Patent: *Jan. 12, 2016

(54) MICRO-ELECTRO-MECHANICAL SYSTEMS (MEMS), SYSTEMS, AND OPERATING METHODS THEREOF

(71) Applicant: TAIWAN SEMICONDUCTOR MANUFACTURING COMPANY, LTD., Hsinchu (TW)

(72) Inventors: Yung-Chow Peng, Hsinchu (TW); Wen-Hung Huang, Hsinchu (TW); Yu-Wei Lin, Chu Bei (TW)

(73) Assignee: TAIWAN SEMICONDUCTOR MANUFACTURING COMPANY, LTD. (TW)

(*) Notice: Subject to any disclaimer, the term of this patent is extended or adjusted under 35 U.S.C. 154(b) by 0 days.

This patent is subject to a terminal disclaimer.

(21) Appl. No.: 14/106,962

(22) Filed: Dec. 16, 2013

(65) Prior Publication Data

US 2014/0225759 A1 Aug. 14, 2014

Related U.S. Application Data

(63) Continuation of application No. 12/856,993, filed on Aug. 16, 2010, now Pat. No. 8,629,795.

(60) Provisional application No. 61/240,830, filed on Sep. 9, 2009.

(51) Int. Cl.
*H03M 1/12* (2006.01)
*H03M 1/00* (2006.01)

(Continued)

(52) U.S. Cl.
CPC ............. *H03M 1/12* (2013.01); *B81B 7/008* (2013.01); *H03M 1/002* (2013.01); *H03M 3/30* (2013.01)

(58) Field of Classification Search
CPC .................................. H03M 1/002; H03M 1/12
USPC .......................... 341/118, 120, 143, 155, 172
See application file for complete search history.

(56) References Cited

U.S. PATENT DOCUMENTS

| 6,459,134 B2 | 10/2002 | Ohguro et al. | |
| 6,593,870 B2* | 7/2003 | Dummermuth | ....... H03M 3/368 341/143 |
| 6,674,383 B2* | 1/2004 | Horsley | ................. H02N 1/002 341/148 |

(Continued)

FOREIGN PATENT DOCUMENTS

| JP | H0758289 | 3/1995 |
| JP | 07-128362 | 5/1995 |

(Continued)

OTHER PUBLICATIONS

Office Action dated Jul. 10, 2013 with English Translation from corresponding application No. JP 2010-200790.

(Continued)

*Primary Examiner* — Linh Nguyen
(74) *Attorney, Agent, or Firm* — Hauptman Ham, LLP

(57) ABSTRACT

A micro-electro-mechanical system (MEMS) includes a micro-mechanical structure that generates a first electrical signal. An analog-to-digital converter (ADC) is coupled with the micro-mechanical structure. The first electrical signal is converted to a second electrical signal using a converter coupled between the micro-mechanical structure and the ADC. The first electrical signal is free from being amplified.

20 Claims, 8 Drawing Sheets

(51) Int. Cl.
*B81B 7/00* (2006.01)
*H03M 3/00* (2006.01)

(56) References Cited

U.S. PATENT DOCUMENTS

| | | | |
|---|---|---|---|
| 6,813,574 B1 | 11/2004 | Yedur et al. | |
| 7,187,735 B2 | 3/2007 | Kent, III et al. | |
| 7,250,892 B2 | 7/2007 | Weinstein et al. | |
| 7,301,775 B2 | 11/2007 | Isoda | |
| 7,425,994 B2* | 9/2008 | Haider et al. | 348/572 |
| 7,497,615 B2 | 3/2009 | Kim et al. | |
| 7,515,721 B2 | 4/2009 | Tashev et al. | |
| 7,658,109 B2 | 2/2010 | Fukuda et al. | |
| 7,899,196 B2 | 3/2011 | Furst et al. | |
| 8,042,012 B2 | 10/2011 | Baker | |
| 8,629,795 B2* | 1/2014 | Peng et al. | 341/155 |
| 2003/0076249 A1 | 4/2003 | Dummermuth et al. | |
| 2004/0130471 A1 | 7/2004 | Lee | |
| 2006/0269186 A1* | 11/2006 | Frame | H03H 7/24 385/12 |
| 2007/0069932 A1 | 3/2007 | Isoda | |
| 2007/0180908 A1* | 8/2007 | Seeger et al. | 73/504.12 |
| 2008/0099887 A1 | 5/2008 | Song et al. | |
| 2008/0128901 A1 | 6/2008 | Zurcher et al. | |
| 2008/0261544 A1* | 10/2008 | Blin | 455/121 |
| 2009/0096651 A1 | 4/2009 | Houng et al. | |
| 2009/0096655 A1 | 4/2009 | Houng et al. | |
| 2009/0278721 A1* | 11/2009 | Hamashita et al. | 341/143 |
| 2010/0194615 A1* | 8/2010 | Lu | H03M 3/454 341/155 |
| 2010/0231429 A1* | 9/2010 | Lu | H03M 3/384 341/150 |
| 2011/0150239 A1* | 6/2011 | Onishi | H03M 1/089 381/94.1 |
| 2011/0267212 A1* | 11/2011 | Denison | G01D 5/24 341/122 |
| 2012/0043974 A1* | 2/2012 | van den Boom | H03M 1/1295 324/658 |
| 2013/0271307 A1* | 10/2013 | Kropfitsch | H03G 3/002 341/158 |

FOREIGN PATENT DOCUMENTS

| | | |
|---|---|---|
| JP | 7128362 | 5/1995 |
| JP | 2001345428 | 12/2001 |
| JP | 2002-538456 | 11/2002 |
| JP | 2008008820 | 1/2008 |
| JP | 2008112992 | 5/2008 |
| JP | 2009112813 | 5/2009 |
| KR | 10-2004-0062823 | 7/2004 |
| TW | 200601125 | 1/2006 |

OTHER PUBLICATIONS

Office Action dated Apr. 26, 2013 from corresponding application No. TW 099130479.

Office Action dated Nov. 28, 2012, with English Translation from corresponding application No. KR 10-2010-0088487.

Office Action dated May 14, 2012 from corresponding application No. KR 10-2010-0088487.

Office Action dated Sep. 5, 2012 from corresponding application No. JP 2010-200790.

Liu, Minjie et al., "Interface Circuit for Capacitive Microaccelerometer", Department of Precision Instruments and Mechanology Tsinghua, University, Beijing, China, IEEE 2008, pp. 654-657.

* cited by examiner

MICRO-ELECTRO-MECHANICAL SYSTEMS (MEMS), SYSTEMS, AND OPERATING METHODS THEREOF

CROSS-REFERENCE TO RELATED APPLICATIONS

The present application claims priority to U.S. Provisional Patent Application Ser. No. 61/240,830 filed on Sep. 9, 2009, and is a continuation of U.S. patent application Ser. No. 12/856,993, now U.S. Pat. No. 8,629,795, filed Aug. 16, 2010, both of which are entirely incorporated by reference herein.

TECHNICAL FIELD

The present disclosure relates generally to the field of semiconductor circuits, and more particularly, to Micro-Electro-Mechanical Systems (MEMS), systems, and operating methods thereof.

BACKGROUND

Micro-Electro-Mechanical Systems (MEMS) refer to the integration of mechanical elements and electronics on a semiconductor substrate through microfabrication technology. While the electronics are fabricated using integrated circuit (IC) processes, the micromechanical elements are fabricated using compatible "micromachining" processes that selectively etch away parts of the silicon wafer to form the mechanical and electromechanical devices.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

DETAILED DESCRIPTION

Figure 1:
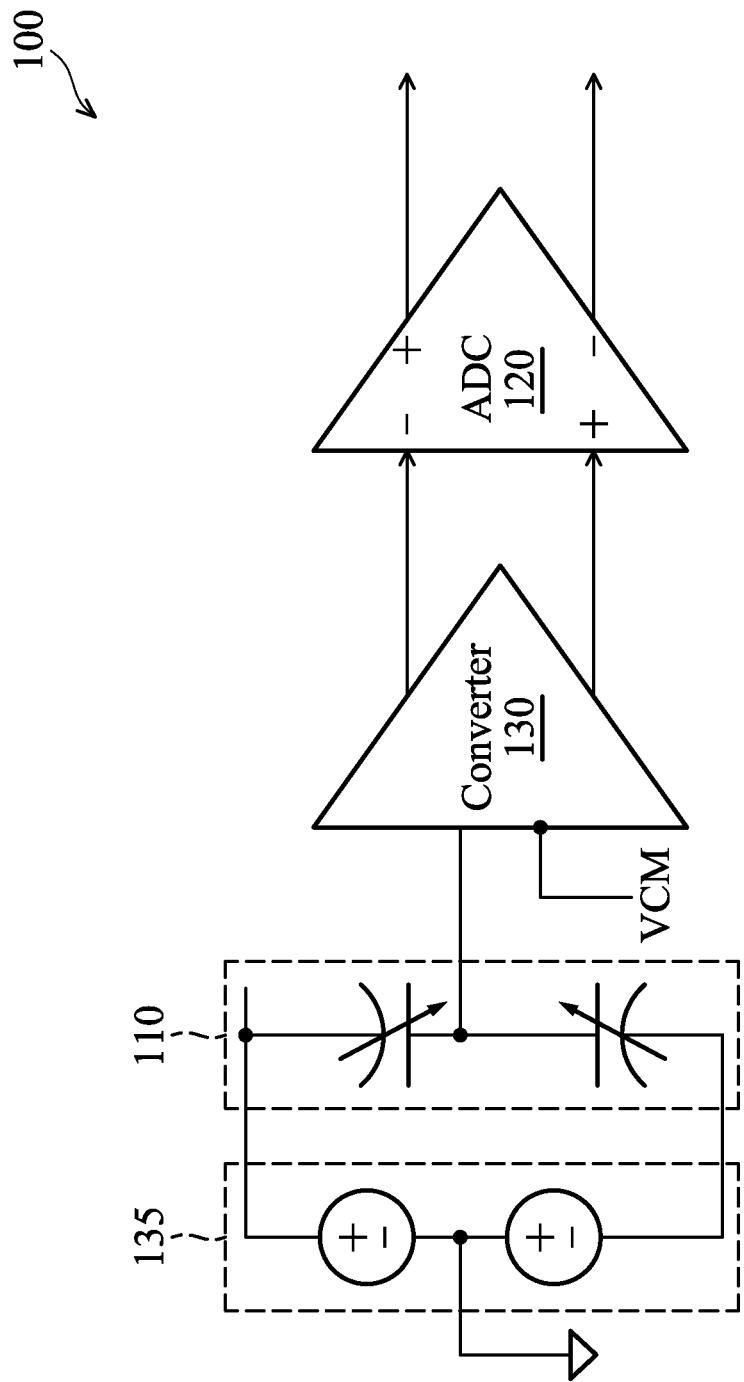
FIG. 1 is a schematic drawing illustrating an exemplary micro-electro-mechanical system (MEMS) including a micro-mechanical structure coupled with an analog-to-digital converter (ADC).

A conventional capacitive microaccelerometer has a micro-mechanical structure disposed over a complementary metal-oxide-semiconductor (CMOS) circuit. The conventional micro-mechanical structure generates a capacitance signal corresponding to a change of a force. The CMOS circuit has an analog circuit and a digital circuit for sensing the capacitance signal. To reduce noises coupled among the digital circuit, the analog circuit, and the conventional micro-mechanical structure, a single shield layer is disposed between the CMOS circuit and the conventional micro-mechanical structure.

Conventionally, the sensed capacitance signal is modulated. The modulated capacitance signal is then converted to a voltage signal. It is found that the voltage signal is weak. The noises coupled between the digital circuit, the analog circuit, and the conventional micro-mechanical structure may undesirably interfere with the voltage signal. To distinguish the voltage signal from the noises, an amplifier is applied to amplify the voltage signal. The amplified voltage signal is demodulated. Another amplifier is applied to amplify the demodulated voltage signal. The double-amplified voltage signal is low-pass filtered and then analog-to-digital converted to digital signals.

As noted, the amplifiers are used to amplify the voltage signal converted from the capacitance of the capacitive microaccelerometer. The amplifiers consume power during the operation. It is also found that the amplifiers take a portion of the chip area.

Based on the foregoing, MEMS having desired power consumption and/or having a desired area, systems, and operating methods thereof are desired.

It is understood that the following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a schematic drawing illustrating an exemplary micro-electro-mechanical system (MEMS) including a micro-mechanical structure coupled with an analog-to-digital converter (ADC). In FIG. 1, a micro-electro-mechanical system (MEMS) 100 can include a micro-mechanical structure 110 coupled with an ADC 120. The MEMS 100 can include a microaccelerometer, a microsensor, a microactuator, a microgyrscope, a bio-MEMS, other suitable MEMS, and/or any combinations thereof.

In various embodiments using a microaccelerometer, the micro-mechanical structure 110 is capable of generating a first electrical signal, e.g., a capacitance signal. The capacitance signal of the micro-mechanical structure 110 can be generated corresponding to a change of a force. The capacitance signal of the micro-mechanical structure 110 can have a desired signal-to-noise ratio (SNR).

The ADC 120 can include a delta-encoded ADC, a flash analog-to-digital converter (ADC), a successive-approximation ADC, a ramp-compare ADC, a Wilkinson ADC, an integrating ADC, a pipeline ADC, a sigma-delta ADC, a time-interleaved ADC, other ADC that can provide a desired resolution and/or have a desired chip area, and/or any combinations thereof. In various embodiments, the ADC 120 can provide a desired resolution for the electrical signal of the micro-mechanical structure 110 such that the electrical signal of the micro-mechanical structure 110 is free from being amplified before the analog-to-digital conversion.

Referring to FIG. 1, in various embodiments the MEMS 100 can include a converter 130. The converter 130 can be coupled between the micro-mechanical structure 110 and the ADC 120. The converter 130 can convert the electrical signal, e.g., a capacitance signal, of the micro-mechanical structure 110 to another electrical signal, e.g., a voltage signal, a current signal, or combinations thereof. In various embodiments using a microaccelerometer, the converter 130 can be a capacitance-to-voltage converter or a capacitance-to-current converter.

Following is the description regarding an exemplary operation of the MEMS 100. Referring to FIG. 1, a modulator 135 can modulate the electrical signal, e.g., a capacitance signal, of the micro-mechanical structure 110. The modulator 135 can provide a carrier signal having a frequency that can be higher than that of the capacitance signal of the micro-mechanical structure 110. The modulation of the capacitance signal can desirably separate the capacitance signal of the micro-mechanical structure from noises.

Referring again to FIG. 1, the converter 130, e.g., a capacitance-to-voltage converter, can convert the modulated capacitance signal to a voltage signal. The voltage signal can be outputted to the ADC 120, e.g., a $2^{nd}$ order delta-sigma ADC. The ADC 120 can demodulate the voltage signal. The ADC 120 can filter, e.g., low-pass filter, the demodulated voltage signal such that a low-pass voltage signal can be obtained. The ADC 120 can convert the low-pass voltage signal to at least one digital signal.

Table 1 shows a comparison between the conventional microaccelerometer and the MEMS 100. With the same SNR, the operating current of the MEMS 100 can be substantially smaller than that of the conventional microaccelerometer.

TABLE 1

|  | Operating current | Area | SNR |
| --- | --- | --- | --- |
| Conventional microaccelerometer | 445 μA | 41,500 μm$^2$ | 75 dB |
| MEMS 100 | 258 μA | 41,300 μm$^2$ | 75 dB |

As noted, the conventional microaccelerometer uses the amplifiers to amplify the voltage signal converted from the capacitance signal. Due to the use of the amplifiers, an operating current of the conventional microaccelerometer is about 445 μA. In contrary to the conventional microaccelerometer, the MEMS 100 is free from including any amplifier between the micro-mechanical structure 110 and the ADC 120 or between the converter 130 and the ADC 120. As noted, the electrical signal of the micro-mechanical structure 110 can have a desired SNR. In various embodiments, the ADC 120 is a $2^{nd}$ order delta-sigma ADC or a higher order delta-sigma ADC. The $2^{nd}$ order delta-sigma ADC or a higher order delta-sigma ADC can provide a desired resolution for the low-pass voltage signal without amplifying the low-pass voltage signal. In various embodiments, the operating current of the MEMS 100 can be about 258 μA. Since the operating current is reduced, the power consumed by the MEMS 100 is reduced. It is also found that the MEMS 100 is free from including any amplifier between the micro-mechanical structure 110 and the ADC 120. The area of the MEMS 100 can also be reduced as shown in Table 1. In other embodiments, the MEMS 100 can be free from including any low-pass filter between the micro-mechanical structure 110 and the ADC 120.

In other embodiments, the ADC 120 can convert the capacitance signal of the micro-mechanical structure 110 to a voltage signal. The ADC 120 can filter, e.g., high-pass filter, the voltage signal. The ADC 120 can demodulate the high-pass voltage signal. The ADC 120 can analog-to-digital convert the high-pass voltage signal to at least one digital signal.

Figure 2A:
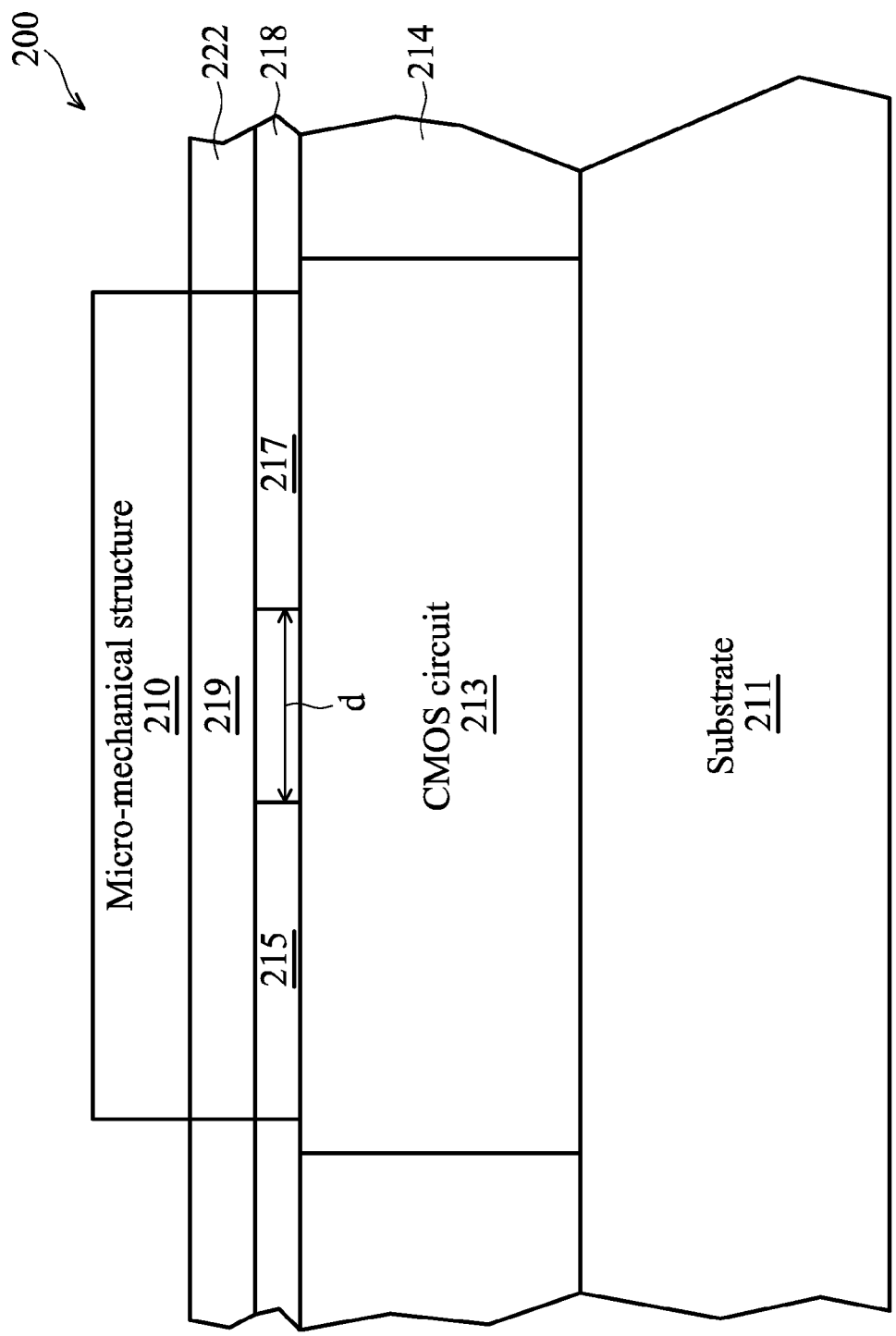
FIG. 2A is a schematic cross-sectional view illustrating an exemplary MEMS disposed over a substrate.

FIG. 2A is a schematic cross-sectional view illustrating an exemplary MEMS disposed over a substrate. In FIG. 2A, a MEMS 200 can include a micro-mechanical structure 210 electrically coupled with a complementary metal-oxide-semiconductor (CMOS) circuit 213. The MEMS 200 can be similar to the MEMS 100 and the micro-mechanical structure 210 can be similar to the micro-mechanical structure 110 described above in conjunction with FIG. 1.

The CMOS circuit 213 can be formed over a substrate 211. The substrate 211 can include an elementary semiconductor including silicon or germanium in crystal, polycrystalline, or an amorphous structure; a compound semiconductor including silicon carbide, gallium arsenide, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In one embodiment, the alloy semiconductor substrate may have a gradient SiGe feature in which the Si and Ge composition change from one ratio at one location to another ratio at another location of the gradient SiGe feature. In another embodiment, the alloy SiGe is formed over a silicon substrate. In another embodiment, a SiGe substrate is strained. Furthermore, the semiconductor substrate may be a semiconductor on insulator, such as a silicon on insulator (SOI), or a thin film transistor (TFT). In some embodiments, the semiconductor substrate may include a doped epi layer or a buried layer. In other embodiments, the compound semiconductor substrate may have a multilayer structure, or the substrate may include a multilayer compound semiconductor structure.

The CMOS circuit 213 can include various diodes, transistors, devices, digital circuits, analog circuits, other CMOS circuits, ASIC circuits, and/or any combinations thereof. In various embodiments, the CMOS circuit 213 can include the modulator 135, the converter 130, and/or the ADC 120 described above in conjunction with FIG. 1.

Referring to FIG. 2A, a dielectric structure 214 can be formed around the CMOS circuit 213. The dielectric structure 214 can isolate the CMOS circuit 213 from other circuits (not shown). In various embodiments, the dielectric structure 214 can include at least one dielectric material such as oxide, nitride, oxynitride, low-k dielectric material, other desired dielectric material, and/or any combinations thereof. The dielectric structure 214 can be formed by, for example, a chemical vapor deposition (CVD) process, a high-density plasma (HDP) CVD process, a high aspect ratio process (HARP), a spin-coating process, other deposition process, and/or any combinations thereof.

Referring to FIG. 2A, a digital shield layer 215 and an analog shield layer 217 can be formed over the CMOS circuit. A dielectric layer 218 can be formed around the digital shield layer 215 and the analog shield layer 217. The digital shield layer 215 and the analog shield layer 217 can include at least one metallic component, such as aluminum, copper, tungsten, titanium, other metallic component, or any combinations thereof. The dielectric layer 218 can include at least one dielectric material such as oxide, nitride, oxynitride, low-k dielectric material, other desired dielectric material, and/or any combinations thereof. The dielectric structure 218 can be formed by, for example, a CVD process, a HDP CVD process, a HARP, a spin-coating process, other deposition process, and/or any combinations thereof.

Referring to FIG. 2A, a wire layer 219 can be formed between the CMOS circuit 213 and the micro-mechanical structure 210. A dielectric layer 222 can be formed around the wire layer 219. The wire layer 219 can electrically couple the micro-mechanical structure 210 with the CMOS circuit 213. The wire layer 219 can include metallic lines, buses, contacts, vias, other connection structure, and/or any combinations thereof. The wire layer 219 can include at least one metallic component, such as aluminum, copper, tungsten, titanium, other metallic component, or any combinations thereof. The dielectric layer 222 can include at least one dielectric material such as oxide, nitride, oxynitride, low-k dielectric material, other desired dielectric material, and/or any combinations thereof. The dielectric structure 222 can be formed by, for example, a CVD process, a HDP CVD process, a HARP, a spin-coating process, other deposition process, and/or any combinations thereof.

As noted, the digital shield layer 215 can shield noises coupled between a digital circuit region (not shown) of the CMOS circuit 213 and the micro-mechanical structure 210. The analog shield layer 217 can shield noises coupled between an analog circuit region (not shown) of the CMOS circuit 213 and the micro-mechanical structure 210. The digital shield layer 215 can be spaced from the analog shield layer 217 by a distance "d" between about 2 μm and about 5 μm. The separation of the digital shield layer 215 and the analog shield layer 217 can desirably reduce the noises coupled among the digital circuit region, the analog circuit region, and/or the micro-mechanical structure 210. Since the noises coupled among the digital circuit region, the analog circuit region, and/or the micro-mechanical structure 210 can be desirably reduced, the electrical signal of the micro-mechanical structure 210 can be sensed and separated from the noises. Amplifying the electrical signal of the micro-mechanical structure 210 can be optional. It is noted that the MEMS 200 described above is merely exemplary. Any MEMS that can provide a desired SNR can be used.

Figure 2B:
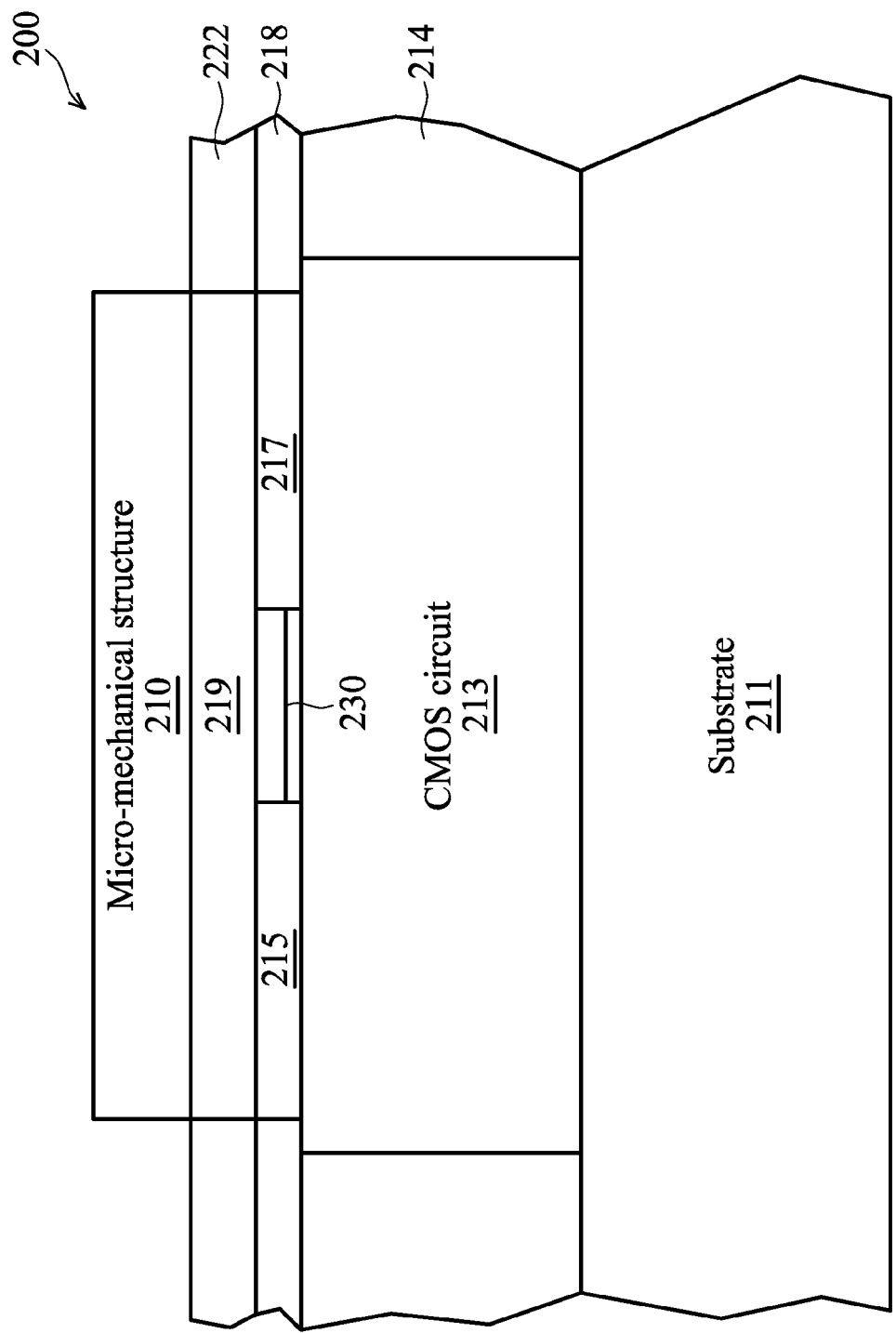
FIG. 2B is a schematic cross-sectional view illustrating another exemplary MEMS disposed over a substrate.

FIG. 2B is a schematic cross-sectional view illustrating another exemplary MEMS disposed over a substrate. Items in FIG. 2B are similar to items described above in conjunction with FIG. 2A. In FIG. 2B, a digital shield layer 225 can be coupled with an analog shield layer 227 through a connection region 230. The connection region 230 can have a pattern that is substantially equal to at least a portion of a routing pattern of at least one metallic layer of the CMOS circuit 213. The digital shield layer 225, the analog shield layer 227, and the connection region 230 can desirably reduce a noise coupled between the CMOS circuit 213 and the micro-mechanical structure 210.

As noted, the CMOS circuit 213 can include at least one metallic layer, e.g., metallic layers M1-M5, for interconnection. The pattern of the connection region 230 can be similar to the routing pattern of the top metallic layer, e.g., M5, of the CMOS circuit 213 that is directly under the connection region 230. In various embodiments, the pattern of the connection region 230 can be similar to the routing pattern of at least one of the metallic layer, e.g., M1-M5, of the CMOS circuit 213 that is directly under the connection region 230.

Figure 3:
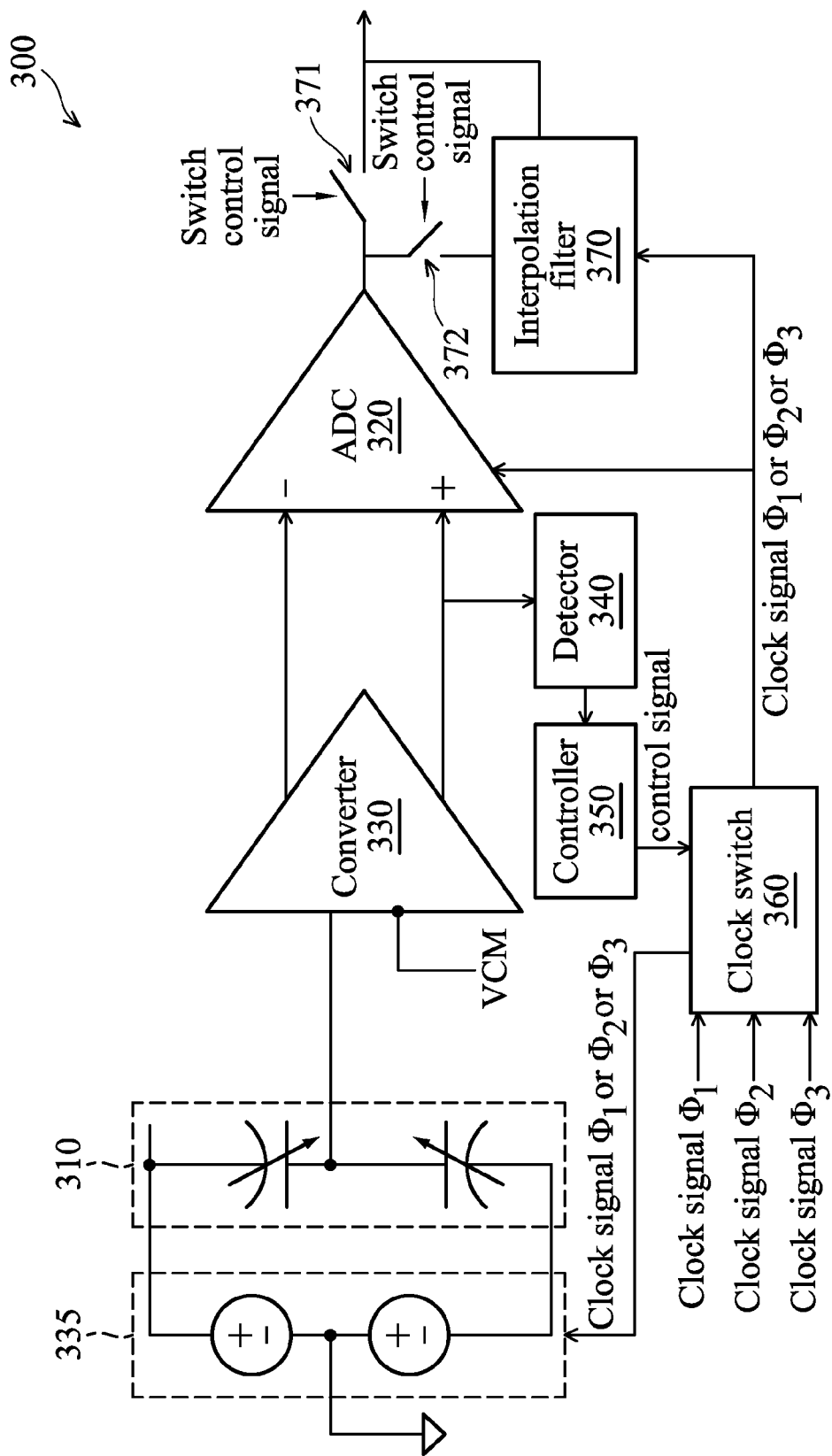
FIG. 3 is a schematic drawing illustrating another exemplary MEMS including a micro-mechanical structure coupled with an analog-to-digital converter (ADC).

FIG. 3 is a schematic drawing illustrating another exemplary MEMS including a micro-mechanical structure coupled with an analog-to-digital converter (ADC). Items of FIG. 3 that are the same items in FIG. 1 are indicated by the same reference numerals, increased by 200. In FIG. 3, a MEMS 300 can include a detector 340, e.g., a squelch detector, which can detect the electrical signal, e.g., a voltage signal, from a converter 330. A controller 350 can be coupled with the detector 340. A clock switch 360 can be coupled with the controller 350.

Figure 4:
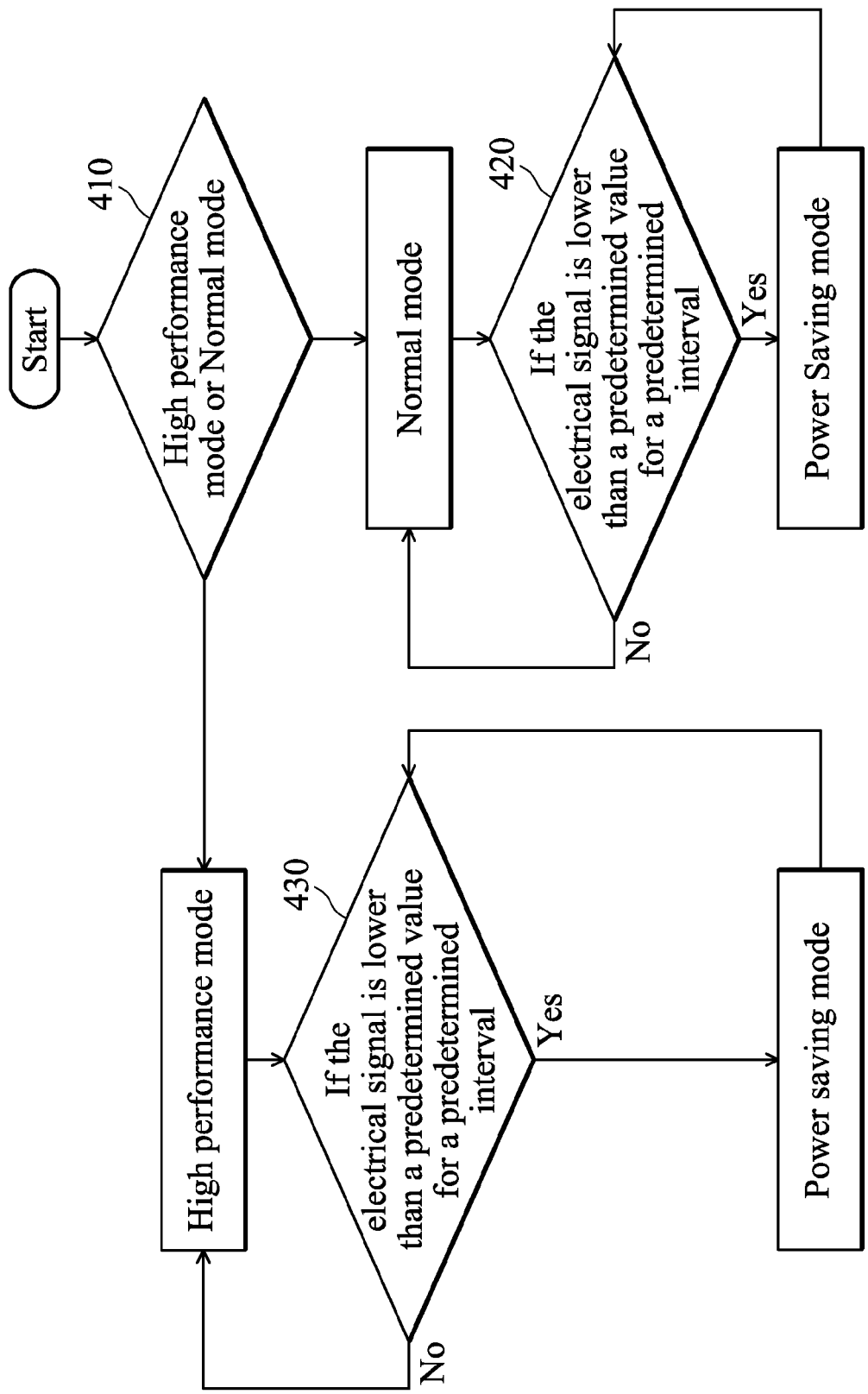
FIG. 4 is a flowchart showing an exemplary method for switching operation modes of a MEMS.

In various embodiments, the MEMS 300 can operate in modes having different sampling frequencies. FIG. 4 is a flowchart showing an exemplary method for switching operation modes of the MEMS 300. Referring to FIGS. 3 and 4, a step 410 can determine if the MEMS 300 operates at a normal mode or a high performance mode. In various embodiments, the normal mode can have a clock signal $\Phi_2$ having a sampling frequency, e.g., 500 kHz, of about a half of a sampling frequency, e.g., 1 MHz, of a clock signal $\Phi_1$ of the high performance mode.

In various embodiments, the MEMS 300 can operate at the normal mode. In a step 420, the detector 340 can detect if an electrical signal, e.g., a voltage signal, from the converter 330 is substantially smaller than a predetermined voltage, e.g., a common mode voltage or ground, for a predetermined interval, e.g., about 10 ms or more. If so, the controller 350 can control the clock switch 360 outputting a clock signal $\Phi_3$ having a sampling frequency, e.g., 250 kHz, for sampling the electrical signal from the converter 330. In various embodiments, the mode for operating the MEMS 300 with the 250-kHz sampling frequency can be referred to as a power saving mode.

If the detector 340 detects that the electrical signal from the converter 330 is not substantially smaller than the predetermined voltage and/or not for the predetermined interval, the controller 350 can control the clock switch 360 outputting the clock signal $\Phi_2$ having the sampling frequency, e.g., 500 kHz, for sampling the electrical signal from the converter 330. As noted, at the power saving mode the sampling frequency is reduced compared with the sampling frequency of the normal mode. The operating current of the power saving mode can be reduced. The power consumed by the MEMS 300 can be reduced.

Referring to FIG. 4, in other embodiments the MEMS 300 can operate at the high performance mode. In a step 430, the detector 340 can detect if an electrical signal, e.g., a voltage signal, from the converter 330 is substantially smaller than a predetermined voltage, e.g., a common mode voltage or ground, for a predetermined interval, e.g., about 10 ms or more. If so, the controller 350 can control the clock switch 360 outputting the clock signal $\Phi_3$ having the sampling frequency, e.g., 250 kHz, for sampling the electrical signal from the converter 330. In various embodiments, the mode for operating the MEMS 300 with the 250-kHz sampling frequency can be referred to as a power saving mode.

If the detector 340 detects that the electrical signal from the converter 330 is not substantially smaller than the predetermined voltage and/or not for the predetermined interval, the controller 350 can control the clock switch 360 outputting the clock signal $\Phi_1$ having the sampling frequency, e.g., 1 MHz, for sampling the electrical signal from the converter 330. As noted, at the power saving mode the sampling frequency is reduced compared with the sampling frequency of the normal mode. The operating current of the power saving mode can be reduced. The power consumed by the MEMS 300 can be declined. It is noted that the number of the clock signals and the sampling frequencies described above are merely exemplary. One of skill in the art can modify them to achieve desired operations for the MEMS 300.

Referring again to FIG. 3, in various embodiments the MEMS 300 can include an interpolation filter 370 for smoothing digital signals output from the ADC 320. In various embodiments, the interpolation filter 370 can be coupled with the clock switch 360. The interpolation filter 370 can receive the clock signal from the clock switch 360.

For example, the MEMS 300 can operate at the power saving mode as described above in conjunction with FIG. 4. As noted, the power saving mode can use the clock signal $\Phi_3$ having the sampling frequency that is lower than those of the normal mode and the high performance mode. In various embodiments operating at the power saving mode, a switch control signal can open a switch 371. Another switch control signal can close a switch 372 coupling the output end of the ADC 320 with the interpolation filter 370. The interpolation filter 370 can receive the clock signal $\Phi_3$ from the clock switch 360. The interpolation filter 370 can interpolate at least one datum between two neighboring digital signals output from the ADC 320. By interpolating data to the digital signals output from the ADC 320, the interpolation filter 370 can smooth the digital signals output from the ADC 320.

In other embodiments, the MEMS 300 can operate at the normal mode or the high performance mode as described above in conjunction with FIG. 4. As noted, the normal mode and the high performance mode can have sampling frequencies that are higher than that of the power saving mode. The ADC 320 can desirably sample the voltage signal from the converter 330. In various embodiments operating at the normal mode or the high performance mode, a switch control signal can open the switch 372. Another switch control signal can close the switch 371 such that the digital signals output from the ADC 320 can bypass the interpolation filter 370. The digital signals output from the ADC 320 can be free from being interpolated. No signal smoothing is performed for the normal mode or the high performance mode. It is noted that the data interpolation and/or smoothing described above are merely exemplary. In other embodiments, the digital data from the ADC 320 under the normal mode and/or the high performance mode can be interpolated. The scope of this disclosure is not limited thereto.

Figure 5:
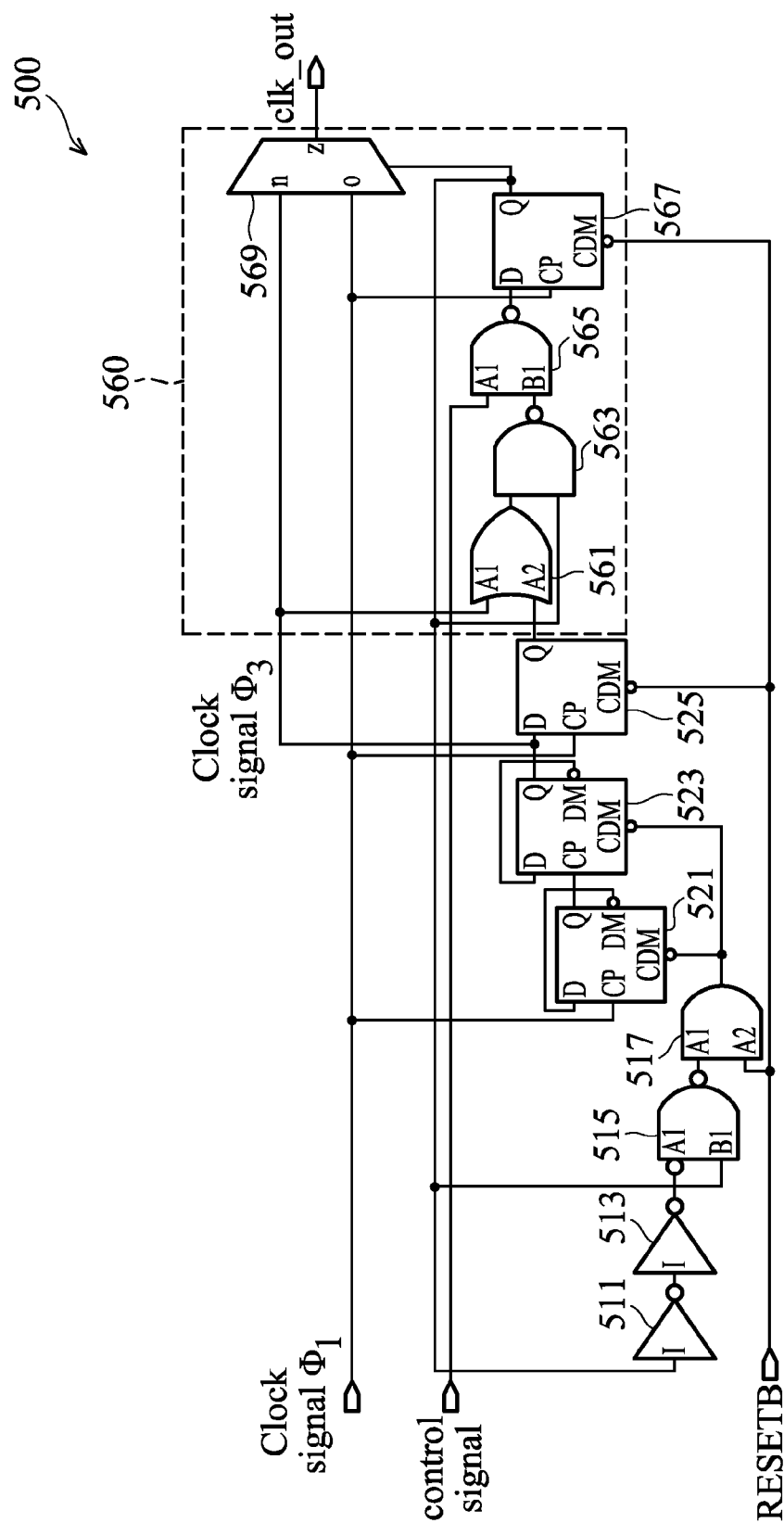
FIG. 5 is a schematic drawing illustrating a portion of a frequency divider including an exemplary clock switch.

FIG. 5 is a schematic drawing illustrating a portion of a frequency divider including an exemplary clock switch. Following is a description related to switching between the clock signal $\Phi_1$ and the clock signal $\Phi_3$. The scope of this disclosure is not limited thereto.

In FIG. 5, a portion of a frequency divider 500 can include a clock switch 560. The clock switch 560 can be similar to the clock switch 360 described above in conjunction with FIG. 3. In various embodiments, the frequency divider 500 can include at least one inverter, e.g., inverters 511 and 513, at least one logic gate, e.g., logic gates 515 and 517, and at least one register, e.g., registers 521, 523, and 525. The clock switch 560 can include at least one logic gate, logic gates, 561, 563, and 565, at least one register, e.g., register 567, and at least one MUX 569.

Referring to FIG. 5, the frequency divider 500 can receive the clock signal $\Phi_1$ having a sampling frequency, e.g., 1 MHz, and a control signal. The control signal can be output from the controller 350 (shown in FIG. 3). The frequency divider 500 can divide the sampling frequency of the clock signal $\Phi_1$ into a low sampling frequency, e.g., 250 kHz, of the clock signal $\Phi_3$. The clock signal $\Phi_1$ and the clock signal $\Phi_3$ can be forwarded to the clock switch 560. The control signal can control the MUX 569 outputting the clock signal $\Phi_1$ or the clock signal $\Phi_3$ corresponding the operation mode of the MEMS 300. It is noted that FIG. 5 merely illustrates a portion of the frequency divider 500 for switching between the clock signal $\Phi_1$ and the clock signal $\Phi_3$. One of skill in the art can modify the portion of the frequency divider 500 to achieve a desired frequency divider that can switch among the clock signal $\Phi_1$, the clock signal $\Phi_2$, and the clock signal $\Phi_3$.

Figure 6:
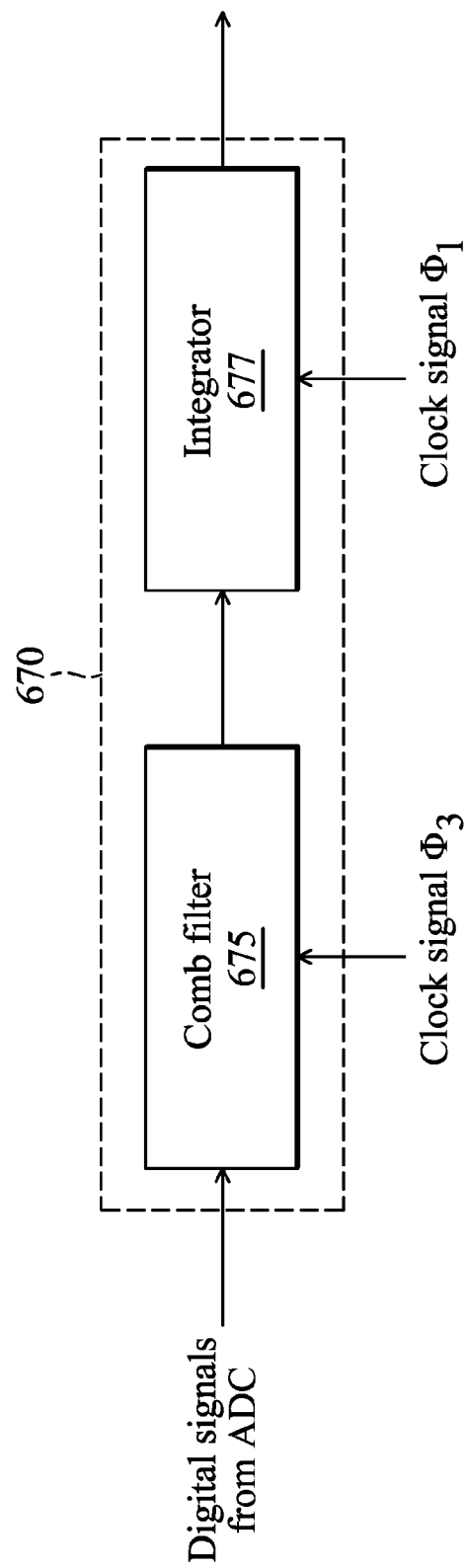
FIG. 6 is a schematic drawing illustrating an exemplary interpolation filter.

FIG. 6 is a schematic drawing illustrating an exemplary interpolation filter. In FIG. 6, the interpolation filter 670 can be similar to the interpolation filter 370 described above in conjunction with FIG. 3. The interpolation filter 670 can include at least one comb filter, e.g., a comb filter 675, and at least one integrator, e.g., an integrator 677. In various embodiments operating a MEMS at the power saving mode, the comb filter 675 can receive the clock signal $\Phi_3$ from the clock switch 360 (shown in FIG. 3) and the integrator 677 can receive the clock signal $\Phi_1$. The interpolation filter 670 can desirably smooth digital signals output from the ADC 320 (shown in FIG. 3).

Figure 7:
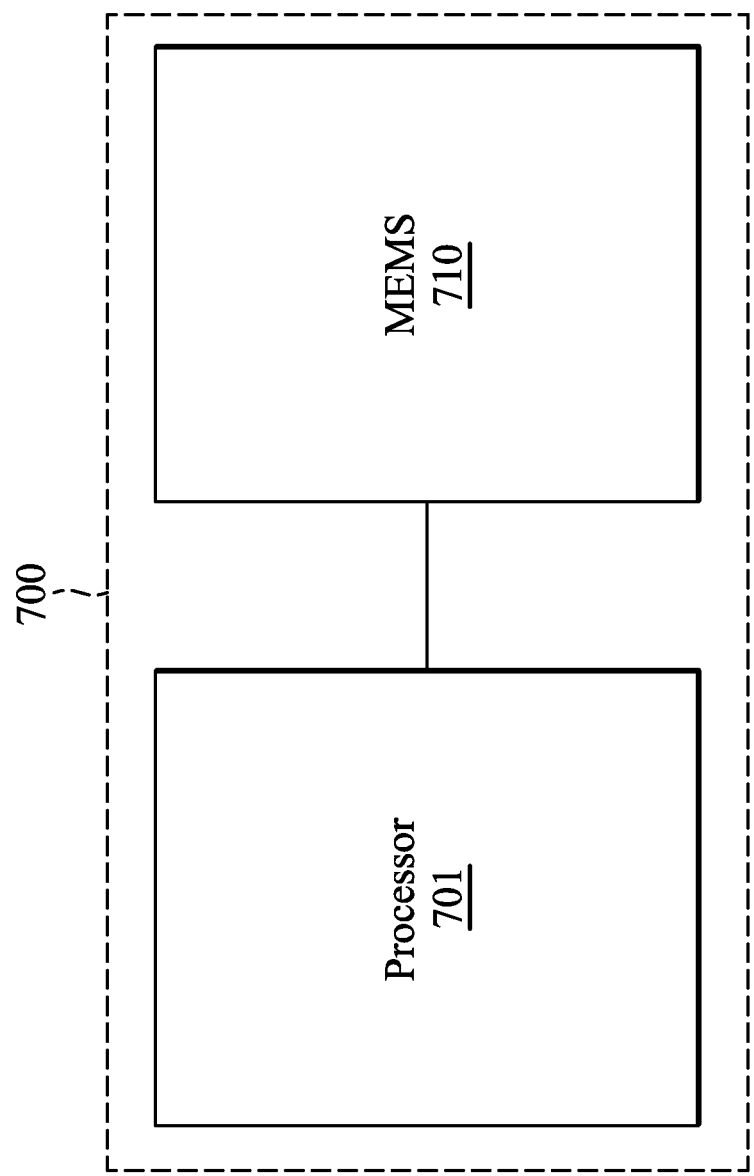
FIG. 7 is a schematic drawing showing a system including an exemplary MEMS coupled with a processor.

FIG. 7 is a schematic drawing showing a system including an exemplary MEMS coupled with a processor. In FIG. 7, a system 700 can include a processor 701 coupled with a MEMS 710. The process 701 can control operations of the MEMS 710. In various embodiments, the MEMS 710 can be similar to one of the MEMS 100, 200, and 300 described above in conjunction with FIGS. 1-3.

In various embodiments, the system 700 can include a game controller, personal media player, a cell phone, a digital camera, a personal computer, an auto vehicle, a displayer, a hard disk driver, a digital versatile disc, a set top box, or any system that can include a micro-mechanical structure.

In various embodiments, the processor 701 and the MEMS 710 can be physically and electrically coupled with a printed wiring board or printed circuit board (PCB) to form an electronic assembly. The electronic assembly can be part of an electronic system such as computers, wireless communication devices, computer-related peripherals, entertainment devices, or the like.

In various embodiments, the system 700 including the MEMS 710 can provides an entire system in one IC, so-called system on a chip (SOC) or system on integrated circuit (SOIC) devices. These SOC devices may provide, for example, all of the circuitry needed to implement a cell phone, personal data assistant (PDA), digital VCR, digital camcorder, digital camera, MP3 player, or the like in a single integrated circuit.

One aspect of this description relates a method that comprises generating a first electrical signal using a micro-mechanical structure. The method also comprises converting the first electrical signal to a second electrical signal using a converter coupled between the micro-mechanical structure and an analog-to-digital converter (ADC) coupled with the micro-mechanical structure, wherein the first signal is free from being amplified.

Another aspect of this description relates to a micro-electro-mechanical system (MEMS) comprising a micro-mechanical structure that is capable of generating a first electrical signal The MEMS also comprises an analog-to-digital converter (ADC) coupled with the micro-mechanical structure to convert the first electrical signal to at least one digital signal, the first signal being free from being amplified. The MEMS further comprises an interpolation filter coupled with the ADC, the interpolation filter being capable of smoothing digital signals output from the ADC.

Still another aspect of this description relates to an apparatus comprising at least one processor, and at least one memory including computer program code for one or more programs, the at least one memory and the computer program code configured to, with the at least one processor, cause the apparatus to generate a first electrical signal via a micro-mechanical structure. The apparatus is also caused to analog-to-digitally convert the first electrical signal to a second electrical signal, wherein the first signal is free from being amplified.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
generating a first electrical signal using a micro-mechanical structure;
converting the first electrical signal to a second electrical signal using a converter coupled between the micro-mechanical structure and an analog-to-digital converter (ADC) coupled with the micro-mechanical structure; and
interpolating at least one datum between the first electrical signal and the second electrical signal based on a clock signal,
wherein the first electrical signal is free from being amplified.

2. The method of claim 1, wherein the interpolating at least one datum between the first electrical signal and the second electrical signal is selectively performed in a normal operating mode.

3. The method of claim 2, further comprising:
actuating a switch to selectively interpolate the at least one datum between the first electrical signal and the second electrical signal to smooth the at least one datum.

4. The method of claim 1, wherein the second electrical signal includes at least one of a voltage signal, a current signal, or a combination thereof.

5. The method of claim 1, further comprising:
detecting the second electrical signal,
wherein the second electrical signal is sampled with a first sampling frequency, if the second electrical signal is substantially smaller than a predetermined value for a predetermined time interval.

6. A micro-electro-mechanical system (MEMS) comprising:
a micro-mechanical structure that is capable of generating a first electrical signal;
an analog-to-digital converter (ADC) coupled with the micro-mechanical structure to convert the first electrical signal to at least one digital signal, the first signal being free from being amplified;
an interpolation filter coupled with the ADC, the interpolation filter being capable of smoothing digital signals output from the ADC; and
a clock switch coupled with the interpolation filter, wherein the interpolation filter is capable of receiving a clock signal from the clock switch.

7. The MEMs of claim 6, wherein the micro-mechanical structure comprises a digital shield layer and an analog shield layer over a CMOS circuit.

8. The MEMS of claim 7, wherein the digital shield layer is spaced from the analog shield layer by a distance of between about 2μm and about 5μm.

9. The MEMS of claim 7, wherein the digital shield layer is coupled with the analog shield layer through a connection region and the connection region has a pattern that is substantially equal to at least a portion of a routing pattern of at least one metallic layer of the CMOS circuit.

10. The MEMS of claim 6, wherein the ADC comprises a $2^{nd}$ order delta-sigma ADC or a higher order delta-sigma ADC.

11. The MEMS of claim 6, further comprising:
a converter coupled between the micro-mechanical structure and the ADC, the converter being capable of converting the first electrical signal to a second electrical signal, wherein the second electrical signal includes at least one of a voltage signal, a current signal, or a combination thereof.

12. The MEMS of claim 11, further comprising:
a detector, the detector being capable of detecting the second electrical signal; and
a controller coupled with the clock switch and with the detector,
wherein the controller is capable of controlling the clock switch outputting the clock signal having a sampling frequency for sampling the second electrical signal, if the second electrical signal is substantially smaller than a predetermined value for a predetermined time interval.

13. The MEMS of claim 6, wherein the MEMS is further free from including any low-pass filter between the micro-mechanical structure and the ADC.

14. The MEMS of claim 6, wherein the micromechanical structure is a microaccelerometer, a microsensor, a microactuator, a microgyrscope, or a bio-MEMS.

15. An apparatus comprising:
at least one processor; and
at least one memory including computer program code for one or more programs,
the at least one memory and the computer program code configured to, with the at least one processor, cause the apparatus to:
generate a first electrical signal via a micro-mechanical structure;
analog-to-digitally convert the first electrical signal to a second electrical signal; and
interpolate at least one datum between the first electrical signal and the second electrical signal based on a clock signal;
wherein the first electrical signal is free from being amplified.

16. The method of claim 15, wherein the apparatus selectively interpolates the at least one datum between the first electrical signal and the second electrical signal in a normal operating mode.

17. The apparatus of claim 16, wherein the apparatus is further caused to:
actuate a switch to selectively interpolate the at least one datum between the first electrical signal and the second electrical signal to smooth the at least one datum.

18. The apparatus of claim 15, wherein the micromechanical structure is a microaccelerometer, a microsensor, a microactuator, a microgyrscope, or a bio-MEMS.

19. The apparatus of claim 15, wherein the apparatus is further caused to:

detect the second electrical signal,
wherein the second electrical signal is sampled with a first sampling frequency, if the second electrical signal is substantially smaller than a predetermined value for a predetermined time interval.

20. The apparatus of claim 15, wherein the micromechanical structure is free from including any low-pass filter between the micro-mechanical structure and the ADC.

\* \* \* \* \*